(12) United States Patent
Gillingham (10) Patent No.: US 6,182,257 B1
(45) Date of Patent: Jan. 30, 2001

(54) BIST MEMORY TEST SYSTEM

(75) Inventor: Peter Gillingham, Kanata (CA)

(73) Assignee: Mosaid Technologies Incorporated, Kanata (CA)

( * ) Notice: Under 35 U.S.C. 154(b), the term of this patent shall be extended for 0 days.

(21) Appl. No.: 09/000,968

(22) Filed: Dec. 30, 1997

(30) Foreign Application Priority Data

Jul. 31, 1997 (CA) ................................. 2212089

(51) Int. Cl.$^7$ ................................. G01R 31/28
(52) U.S. Cl. ................................. 714/733; 714/718
(58) Field of Search ................................. 714/733, 734, 714/735, 736, 710, 718, 721, 7, 8, 742; 365/200–201

(56) References Cited

U.S. PATENT DOCUMENTS

| 5,051,995 | 9/1991 | Tobita | 365/201 |
|---|---|---|---|
| 5,173,906 | 12/1992 | Dreibelbis et al. | 714/736 |
| 5,471,482 | * 11/1995 | Byers et al. | 714/718 |
| 5,481,551 | * 1/1996 | Nakano et al. | 714/740 |
| 5,535,164 | 7/1996 | Adams et al. | 365/201 |
| 5,557,619 | * 9/1996 | Rapoport | 714/733 |
| 5,568,437 | 10/1996 | Jamal | 365/201 |
| 5,764,878 | * 6/1998 | Kablanian et al. | 714/6 |
| 5,784,323 | * 7/1998 | Adams et al. | 365/201 |
| 5,987,632 | * 11/1999 | Irrinki et al. | 714/711 |

OTHER PUBLICATIONS

Rajsuman et al. Testing Embedded Cores, IEEE, pg. 81 to 85, Jun. 1997.*
Takeshima et al., Voltage Limiters for DRAM's with Sub-strate–Plate–Electrode Memory Cells, Feb. 1988.*

* cited by examiner

Primary Examiner—Albert De Cady
Assistant Examiner—Shelly A. Chase
(74) Attorney, Agent, or Firm—Kevin Pillay; Fasken Martineau DuMoulin LLP (57) ABSTRACT

A semiconductor device having a self test circuit including an embedded dynamic random access memory array for storing data, a self test controller for internally generating test data patterns and expected resulting data and for comparing the expected resulting data with actual resulting data, test interface circuitry for loading the test data patterns into the memory and reading back the actual resulting data from the memory, means for selectively programming a voltage level to be applied to a selected cell plate of the memory according to predetermined test requirements and means for storing an address of a defective memory cell. In addition, the semiconductor device includes means for repairing a defective memory row or column in response to a signal received from the self test controller.

9 Claims, 6 Drawing Sheets

BIST MEMORY TEST SYSTEM

This invention relates generally to apparatus method for testing and repairing semiconductor memories and more specifically, to a built-in self test and repair system.

BACKGROUND OF THE INVENTION

Built-in self test (BIST) systems usually operate under fixed test conditions; i.e. fixed temperature and fixed voltages. This limits the range of possible scenarios which may be tested and not all scenarios faced by a device once it is in full production usage may be tested. Specifically, data storage integrity in dynamic random access memories (DRAM) can be compromised by cell leakage caused by a variety of reasons including alpha particles, hot electrons, and substrate current. Memory cells have certain operation margins which, if exceeded, will cause the cell to lose data stored therein. As a result, it is important to test a device under the worst-case scenarios in order to determine the cell's retention capabilities.

A supply voltage fluctuation test or voltage bump test is a standard test performed on standard DRAMs which is capable of testing operating margins of these cells, using an external tester. However, embedded memories cannot use standard memory testers to perform this and other tests due to the multitude of other functions contained in the integrated circuit. As a result, BIST systems provide a practical solution to testing embedded memories. BIST systems, however, usually operate at nominal temperature and voltage levels. As a result, the extreme conditions tested by the bump test are not covered. Our production testing the operating conditions are usually extended well beyond device ratings to ensure there is adequate operating margin.

Further, in standard DRAM and SDRAM applications, external testers perform a variety of tests including the voltage bump test to verify the memory cells' data retention capabilities. Under normal operations, the DRAM cell plate is held at a DC voltage, typically VCC/2. During the cell plate voltage bump test, two different voltage values are used, for example VCC/2−ΔV and VCC/2+ΔV. During the bump test, bits are written with one value of the cell plate voltage and read back with the other value. When the value of the cell plate is higher when writing than reading, the operation margin on stored '1's is tested. When the value of the cell plate is lower when writing than reading, the operation margin on stored '0's is tested.

Figure 1A:
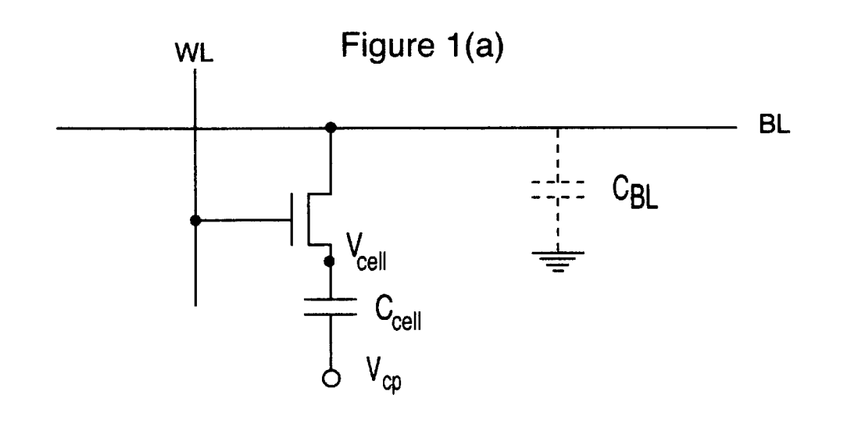
FIG. 1(a) is a circuit diagram illustrating a standard dynamic random access memory cell combination.

Referring to FIG. 1(a), the concept of the voltage bump test is illustrated. A typical DRAM memory cell, word line WL and bit line BL structure is shown. Under nominal operating conditions, the cell plate voltage VCP=VCC/2, the bit line BL is precharged to VCC/2, the word line receives a voltage VPP for reading or writing the data stored in the memory $C_{cell}$. The charge delivered to the bit line BL is given by the formula:

$$Q=(C_{cell}/(C_{cell}+CBL))(V_{cell}-\tfrac{1}{2}VCC)CBL$$

where $V_{cell}$=VSS ('0') or VCC ('1')

When the voltage bump test is performed, a ±ΔV bump step is applied to VCP before reading. The charge delivered to the bit line is now given by:

$$Q=(C_{cell}/(C_{cell}+CBL))(V_{cell}-\tfrac{1}{2}VCC\pm\Delta V)CBL$$

Figure 1B:
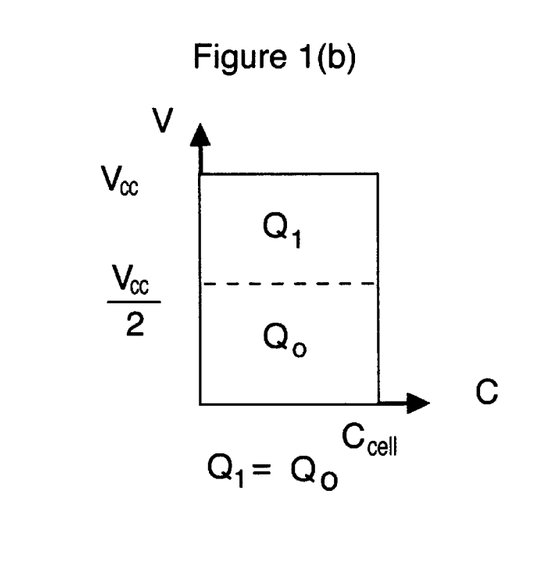
FIG. 1(b) is a graph showing a voltage versus capacitance plot for nominal operating conditions of a memory cell.
Figure 1C:
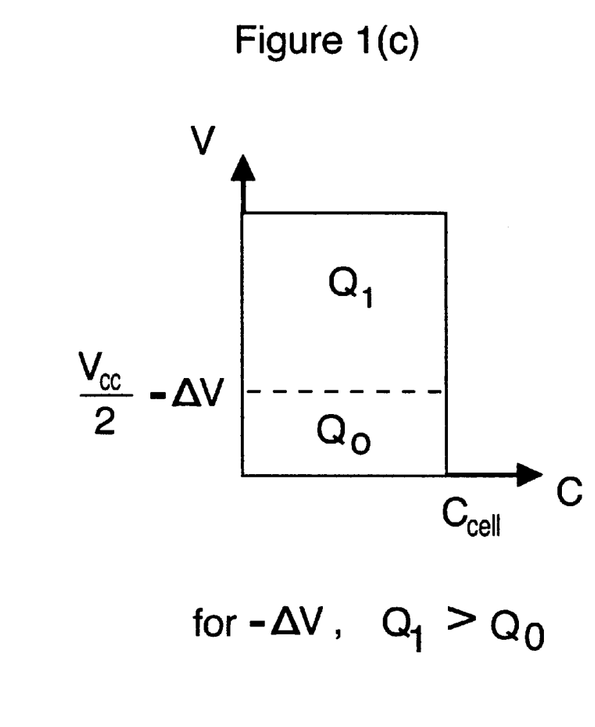
FIG. 1(c) is a graph showing a voltage versus capacitance plot for positive voltage bump test applied to a memory cell.
Figure 1D:
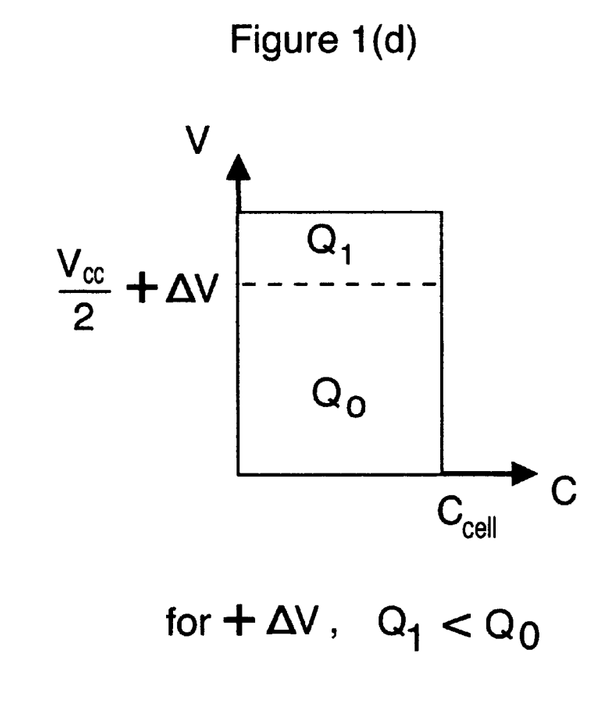
FIG. 1(d) is a graph showing a voltage versus capacitance plot for negative voltage bump test applied to a memory cell.

Based on whether ΔV is a positive bump or a negative bump, the charge delivered to the bit line will benefit either a stored '0' or '1'. FIGS. 1(b), 1(c) and 1(d) illustrate the voltage versus capacitance charge distributions for the three cases: nominal, ΔV positive and ΔV negative, respectively. Q0 represents the charge for a stored '0' and Q1 represents the charge for a stored '1'. As can be seen, when ΔV is positive, a stored '1' provides more charge to the bit line and therefore has a higher margin than a stored '0' which provides less charge to the bit line. Conversely, when ΔV is negative, the stored '0' has better retention capabilities than a stored '1'. By performing these tests, the margin on each cell for storing a '0' or a '1' can be verified. A voltage bump test circuit is described in U.S. Pat. No. 5,051,995.

Secondly, embedded memories usually employ a BIST system to perform the testing of the memory. The main concept of BIST is to move most of the test functionality into the silicon of the device being tested. Embedded memories require this type of testing since they do not have any external access pads or other means to connect to the external testers for testing. As a result, test systems integrated directly into the embedded memory device. U.S. Pat. No. 5,173,906 entitled "BUILT-IN SELF TEST FOR INTEGRATED CIRCUITS" illustrates such a system for an embedded SRAM macro. This system includes an input data pattern generator for generating predetermined data to be applied to the data inputs of the memory, an address counter for applying test address signals to the address inputs of the memory, an expected data pattern generator, which may be the same as the input data pattern generator, for generating expected data, a comparison circuit for comparing the expected data and the resulting data. The system is controlled by a state machine during the test sequence. The test patterns available are unique address ripple word (UARW), unique address ripple bit (UARB), checkerboard, (CHKBD), word line strip (WLS), blanket (BL) and programmable (PG). Since this BIST is designed for embedded SRAM's however, there is no provision for a voltage bump test. This system, however, does not perform a volt bump test on embedded memories, neither does it provide a facility for repairing defective memory. Recently embedded DRAMs have become widely used. Thus, here exists a need for a system that is capable of providing a built in self test along with an automatic repair of defective memory.

SUMMARY OF THE INVENTION

This invention seeks to provide a BIST system for an embedded dynamic random access memory, integrated in a single semiconductor device, including a provision for performing a voltage bump test of the embedded memory and using the test results to repair faulty memory locations.

According to an embodiment of the present invention, a semiconductor device capable of performing self test comprises: an embedded dynamic random access memory array for storing data, a built-in self test controller for internally generating test data patterns and expected resulting data and for comparing the expected resulting data with actual resulting data, test interface circuitry for loading the test data patterns into the memory and reading back the actual resulting data from the memory, means for selectively programming a voltage level to be applied to the cell plate of the memory according to predetermined test requirements.

The memory further including redundancy circuitry for replacing faulty elements with redundant elements using the results from a test sequence.

An advantage of the present invention is that the data retention abilities of an embedded dynamic random access memory can be tested quickly and efficiently. An additional advantage of the present invention is that its additional test capabilities occupy minimal silicon area in addition to the existing BIST circuitry area. A further advantage of the present invention is the ability to detect errors and subsequently correct them without external interference in the form of standard redundancy replacement techniques.

BRIEF DESCRIPTION OF THE DRAWINGS

A better understanding of the invention will be obtained by reference to detailed description below in conjunction with the following drawings in which.

DETAILED DESCRIPTION OF A PREFERRED EMBODIMENT

Figure 2:
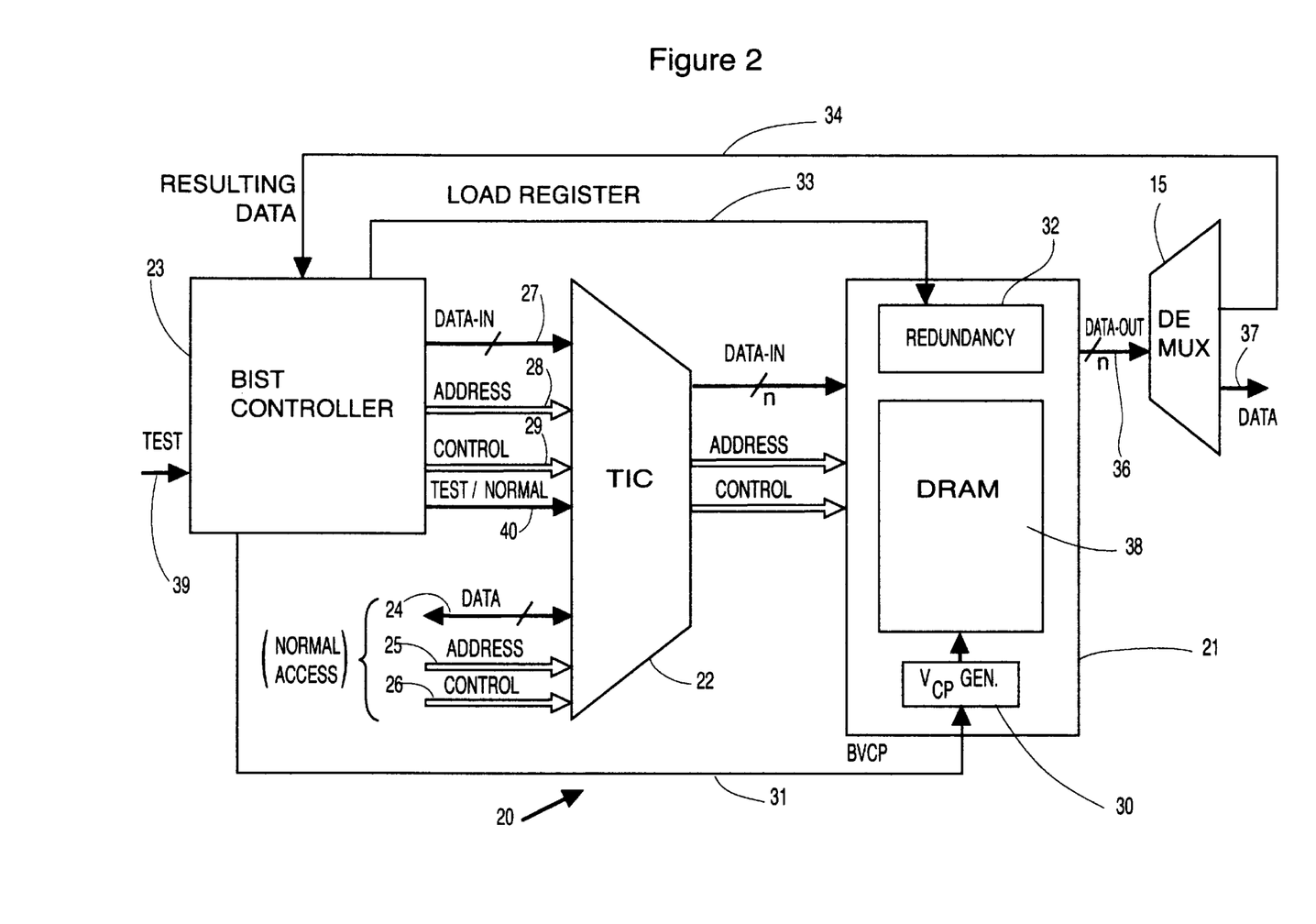
FIG. 2 is a block diagram of a BIST system according to an embodiment of the present invention.

Referring to FIG. 2, a block diagram illustrating the main components of the built-in self test and repair system according to an embodiment of the present invention is shown generally by numeral 20. The system comprises an embedded dynamic random access memory (DRAM or SDRAM), a test interface circuit TIC22, a BIST controller 23, a normal access data bus 24, an address bus 25 and control signals 26. The BIST controller 23 includes a data-in bus 27, an address bus 28 and control signals 29. The memory 21 further comprises memory cells 38, cell plate voltage VCP generator 30 which receives a signal BVCP 31 for selectively setting the value of VCP according to the test requirements (discussed later). The memory also includes redundancy circuitry 32 which in turn receives redundant addresses signals 33 from the BIST controller 23 based on faulty address locations located during the test sequence. The TIC22 is basically a multiplexer implementation for selecting between normal or BIST operation mode. A data-out bus 36 for the memory 21 is routed to a de-multiplexer 15, which selectively routes the data-out 36 to either the BIST controller 23 along a BIST resulting data line 34 or to an external data-out bus 37.

In addition, the preferred embodiment allows for selectively setting the value of the cell plate voltage at various stages of the test sequence.

Figure 3:
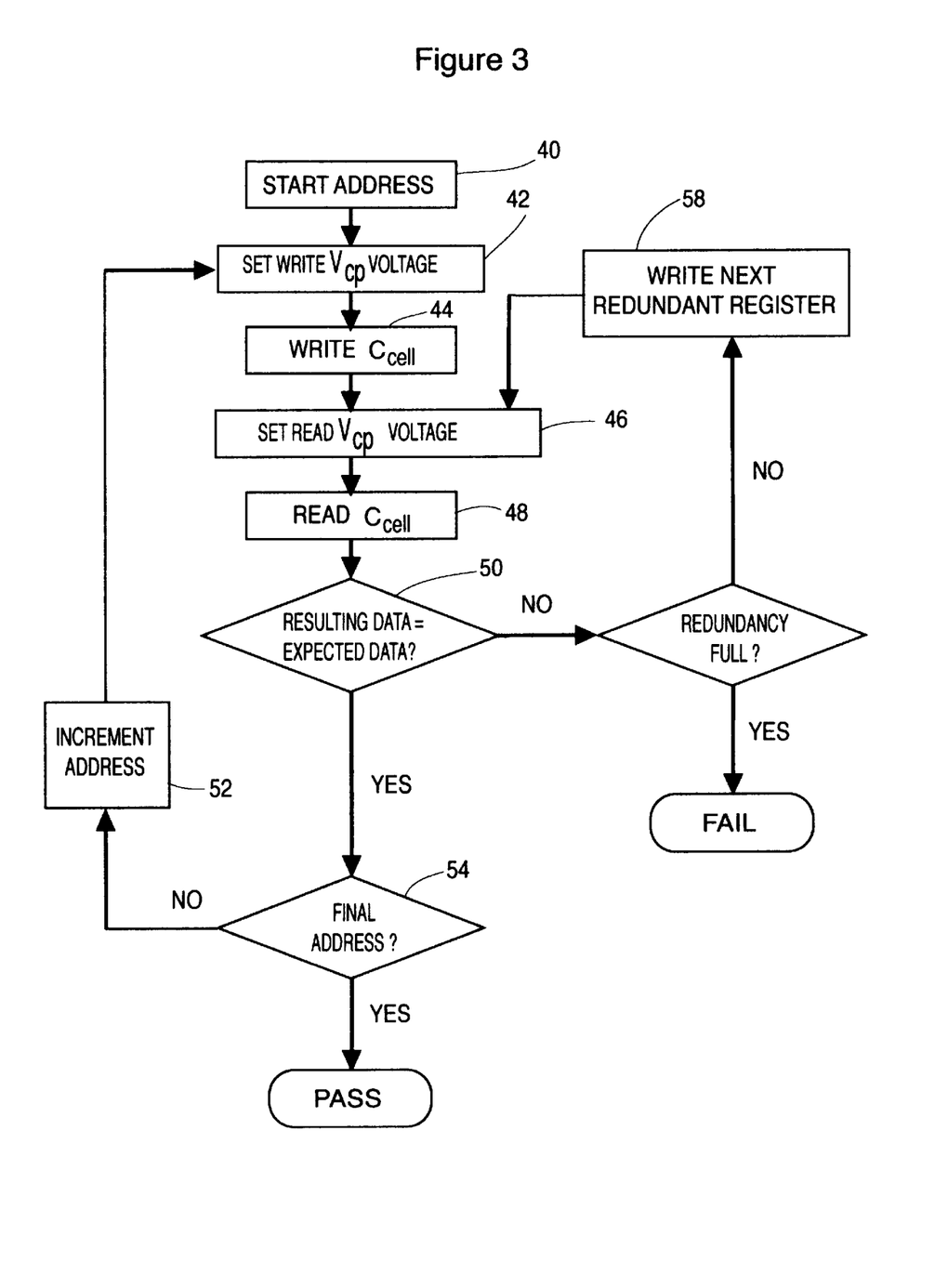
FIG. 3 is a flow chart illustrating a test methodology according to the present invention.

The operation of the system shown in FIG. 2 will now be discussed with reference to FIG. 3 and in which like elements are referred to by similar numerals. Thus, referencing both FIGS. 2 and 3, the BIST controller 23 initiates its test sequence in response to the external control signal 39 by indicating via the TEST/NORMAL signal line 40 that the memory is beginning self test, a typical BIST test pattern known in the art is used to test the memory. The controller 23 independently generates the test pattern and begins the shifting of test data via the data-in lines 27. The BIST address input 28 specifies the memory locations to test. The BIST control input 29 provides the test interface circuitry with the TIC 22 control signals required to control the test sequence. The test interface circuitry allows the data 27, address 28 and control signals 29 to be passed on from the BIST controller 23 to the memory 21.

Each address location is temporarily stored in address latches (not shown) within the controller 23. The controller 23 begins with a start address at step 40. For every address location; the controller 23 determines and indicates, via the BVCP signal 31, a value of VCP for writing of the test bit shown in step 42. The test bit is then written to the specific address location at step 44. Once the write operation has been successfully completed, the BIST resets VCP to the voltage required for the read portion of the test step 46. The resulting bit is then read back step 48 and routed back to the BIST controller for comparison with an expected bit generated earlier by the BIST controller step 50. If the bits match, the cell passes that margin test, and the address is incremented to the next address step 52 according to the specific test pattern. If the address is the last address in the test sequence step 54 and no faults have been detected, the device is deemed to pass the overall voltage bump test.

If, on the other hand, the bits for the address location under test do not match, the cell has failed its margin test and as a result, must be replaced. The address location of the faulty cell is loaded into a redundant register step 58 which is part of the redundancy circuitry to be described below. Since there is a finite number of possible replacements, if the current replacement exceeds the number of replacement available, the overall device will be deemed to have failed the bump test. If, on the other hand, there are more replacements possible, the test resumes by re-testing the redundant cell in the same manner as the normal cell was tested. If the redundant cell passes, the test continues on to the next address in the test sequence. If the redundant cell fails, another replacement is attempted until all replacements are exhausted.

It should be noted that the replacement portion of the algorithm is not essential to the operation of the rest of the system. In fact, the replacement of the faulty locations is a further enhancement of an embodiment of the current invention by making use of the information obtained through the bump test. The faulty locations could alternately simply be stored or output to the system for further use.

Figure 4:
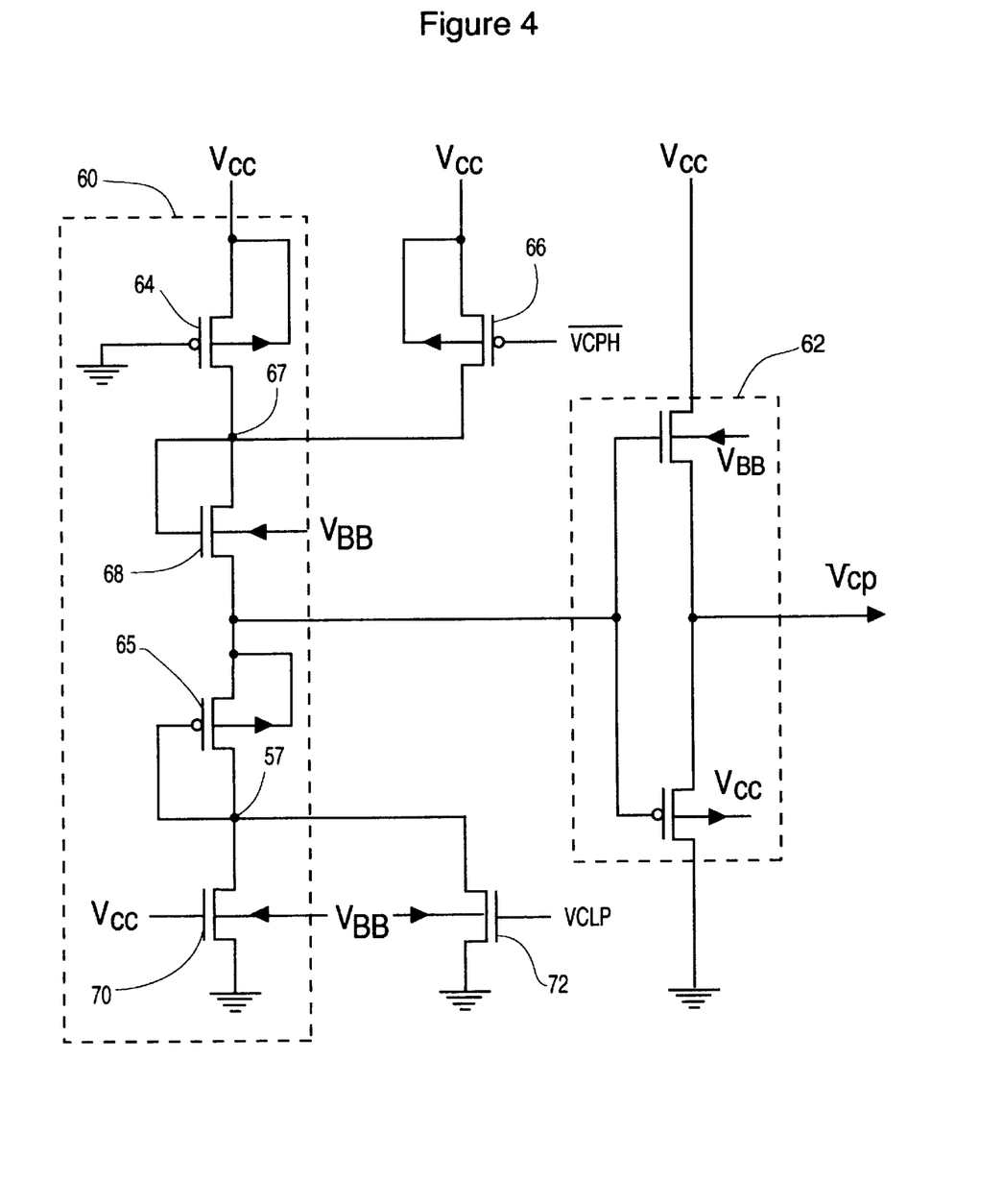
FIG. 4 shows a schematic circuit diagram of a cell plate voltage generator according to an embodiment of the present invention.

Turning now to FIG. 4, the cell-plate voltage generator 30 shown in FIG. 2 is described in greater detail. The circuit includes a controllable voltage divider string indicated by block 60 followed by a low impedance driver 62 is used to generate VCP. The transistor connected diode string acts as a voltage divider, comprises PMOS transistors 64 and 66 having their source/drain circuits connected in parallel between the power supply VCC and a node 67. The PMOS transistor 64 is preferably a long channel device whose resistance is much greater than that of PMOS 66. The well connections for both PMOS transistors 64 and 66 are connected to VCC. Further connected to node 67 is the drain and gate of NMOS transistor 68 which also acts as a diode. The substrate of NMOS transistor 68 is connected to VBB, a negative on-chip generated voltage used to prevent forward biasing of the implant-well junctions. Other NMOS transistors may be connected similarly to NMOS transistor 68 to form a string of diode-connected NMOS transistors. Similarly, a diode-connected PMOS 52 transistor is connected to the source of NMOS transistor 68. Finally, NMOS transistors 70 and 72 are connected in parallel between a node 74 and ground, where NMOS transistor 70 preferably has a much larger resistance than that of NMOS transistor 72. The gates of the long channel devices 64 and 70 are connected to ground and VCC respectively. The gates of devices 66 and 72 receive $\overline{\text{VCPH}}$ and VCPL respectively the phrase "which comprise the BVCP signal".

In operation, the cell-plate voltage generator selectably sets the value of VCP based on whether a nominal VCC/2 cell plate voltage or a bump VCC/2±ΔV cell plate voltage is required. When the embedded memory is not undergoing any test, the control signals VCPL and $\overline{\text{VCPH}}$ are inactive and the voltage is generated purely from the voltage divider action of transistors 64, 68, 65, and 70 (and any other transistors connected in that string if necessary). More specifically, $\overline{\text{VCPH}}$ is 'high', and VCPL is 'low'. During a test sequence initiated by the BIST system, one of two possible states of the control signals the phrase "VCPL, $\overline{\text{VCPH}}$" can be selected by the BIST controller, as indicated by Table 1:

TABLE 1

Selectable VCP values

| $\overline{\text{VCPH}}$ | VCPL | VCP Output |
|---|---|---|
| 0 | 0 | VCC/2 + ΔV |
| 0 | 1 | 'invalid' |
| 1 | 0 | VCC/2 |
| 1 | 1 | VCC/2 − ΔV |

The second combination marked 'invalid' should not be used since it will provide a short circuit path between VCC and ground VSS.

By selectively enabling the above mentioned transistors according to the states described in Table 1, the VCP output can be varied and can therefore be used to perform voltage bump tests on the embedded memory. For example, if testing the data retention capabilities of a '1', VCP would begin at a value higher than VCC/2, for example, VCC/2+ΔV, subsequently, a '1' would be written into the cell. VCP would then be bumped low to a lower value VCC/2−ΔV and the bit stored in the cell would be subsequently read out. If a '1' would result, then the cell has an adequate '1' margin. If the '1' would have changed into a '0', the cell would not have passed the bump test and its address location would be loaded into the redundancy circuitry for repair as will be described below. Similarly, if a '0' margin is to be tested, VCP would be started at a value lower than VCC/2, for example VCC/2−ΔV, subsequently a '0' would be written into the cell. VCP would then be bumped high to a high value VCC/2+ΔV and the bit stored in the cell would be subsequently read out. If a '0' would result then the cell has an adequate '0' margin. If the '0' would have changed into a '1' the cell would not have passed the bump test and its address location would be loaded into the redundancy circuit for repair. This procedure can be repeated for all memory cell locations based on the specific BIST test pattern.

Figure 5:
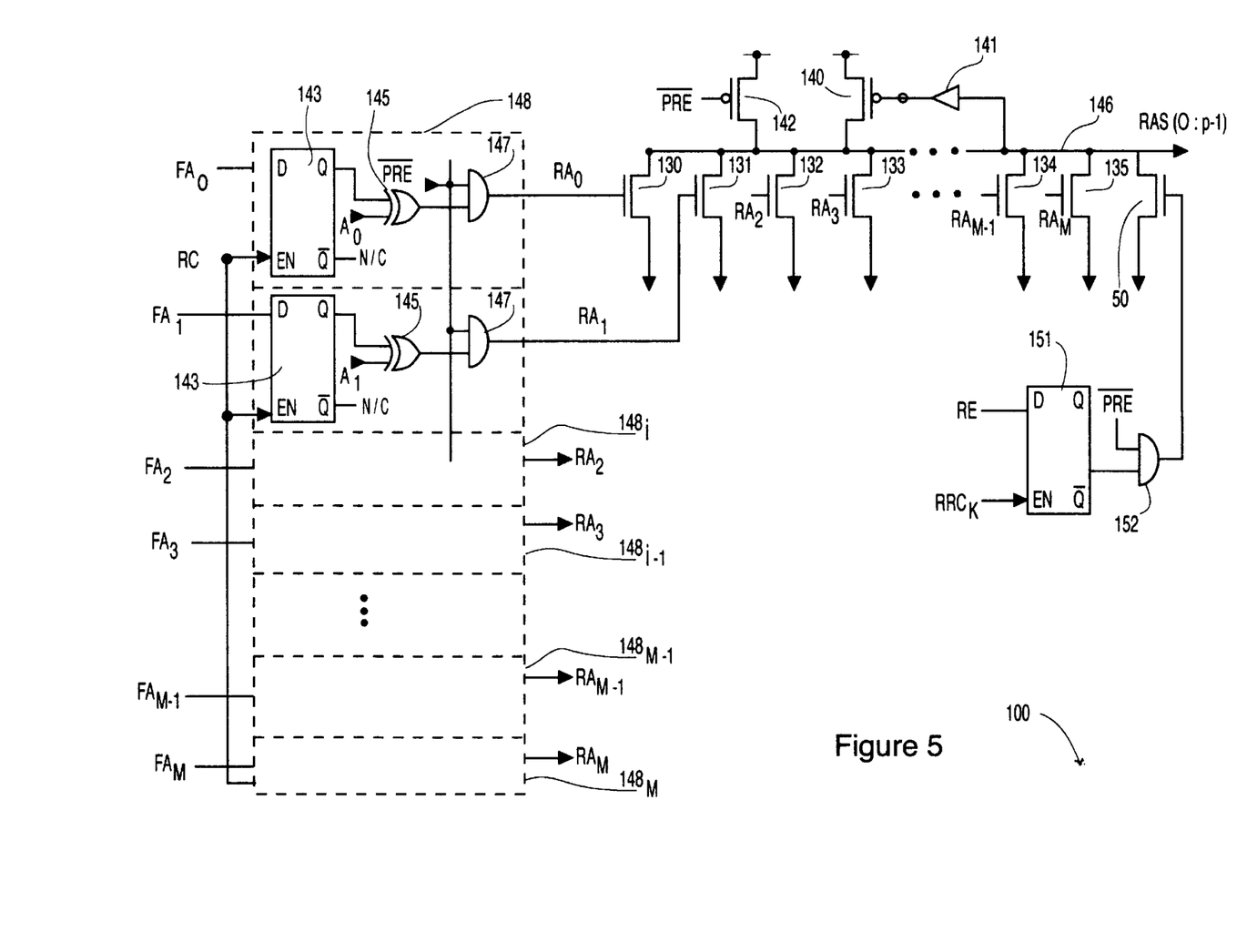
FIG. 5 shows a redundancy programming circuit according to an embodiment of the present invention.

Referring now to FIG. 5 an embodiment of the redundant programming circuit according to the present invention is shown generally by numeral 100. In this circuit both column or row replacement can be implemented. Various decoders and drivers which are well known in the art may be used.

The circuit provides for the storage and usage of the faulty address locations resulting from the BIST test sequence to replace faulty locations identified during the BIST controller test operation. The programming circuit comprises a reset device 142 coupled between VCC and an output 146 and a half-latch 140 and 141 also coupled between VCC and the output 146. Redundant programming devices 130–135 are coupled in parallel between the output 146 and ground, and receive redundant address bits RA0, $\overline{\text{RA0}}$ . . . RAn, $\overline{\text{RAAN}}$ at their gate inputs. These redundant addresses are each obtained from a redundant address generator 148 consisting of a 1-bit register receiving the faulty address location loaded by the BIST controller 23 upon detection of a fault during the test sequence, and some compare and enabling logic. The registers are indicated by numerals 143, 144 and are implemented by standard D-type flip/flops which receive the faulty address bit FAi, F $\overline{\text{Ai}}$ on their D-inputs and provide alternating Q, $\overline{\text{Q}}$ outputs to an exclusive-OR gate, which in turn additionally receives the actual address location being tested.

An additional control signal from the BIST controller, redundant register control $RRC_k$, is used to enable the register. The output from the exclusive-OR gate 145 is input into a NAND gate 146 which combines the result of the comparison with the precharge signal $\overline{\text{PRE}}$ which is 'low' during precharge and 'high' during active read or write memory mode. This structure is repeated for each complementary address bit from 0 to (m−1) of an m-bit address, as shown by the dashed boxes $148_i, 148_{i+1}, \ldots 148_{2n}$.

The described redundant address generator 100 simulates the action of a fuse connected in series with one of the redundant programming devices 130–135 which would, in that case, receive the actual address location at the inputs. That implementation is common in the art, but if fuses are not available due to the device application, a register redundancy scheme, as described in the embodiment of the present invention, should be used. The BIST environment, in fact, provides an ideal setting for register redundancy implementation since the testing and detection of faulty locations can and do occur after manufacturing. Therefore, the faulty address must be internally managed to repair the damaged location.

To cover the case when no redundancy is required, a separate device 150 receives at its input the combination of the precharge signal $\overline{\text{PRE}}$ and a redundancy enabled signal RE which is first stored in a register under the same BIST control as the redundant address generator registers, namely RRC. This additional register plays the role of a master redundancy fuse.

The redundancy programming circuit, generally indicated by numeral 149, represents one of p existing redundancy programming circuits. The output RAS(0:p−1) 146 is input into a redundant decoder (not shown) as is well known in the art, used to select the redundant row or column and to disable the normal row or column. The output 146 can be further used to indicate whether a redundancy programming circuit has been already used for 23 replacement; this can be accomplished by feeding back output 146 to the BIST controller. If the RAS(0:p−1) signal is 'low', the BIST controller knows that that particular programming circuit is still available for replacing faulty elements. If the RAS(0:p−1) sign is 'high' however, the BIST controller knows that that particular programming circuit has already been used. Alternately, a register counter system could be used inside the BIST controller to keep count of how many registers have been used and how many are still available for replacement.

In operation, during precharge, the redundancy precharge signal $\overline{\text{PRE}}$ is brought 'low', thereby bringing RAS(0:p−1) 'high'. This state is latched by the half latch 140, 141. At the start of an active cycle, the $\overline{\text{PRE}}$ signal is brought 'high'. If no redundancy is required, the RAS(0:p−1) 146 is pulled 'low' by pull-down transistor 150, in response to a low RE signal into register 151; the 'high' $\overline{\text{PRE}}$ signal combined with the $\overline{\text{Q}}$ output of the register in the AND gate 152 will result in a 'high' being applied to the gate of transistor 150. If on the other hand, a faulty memory location is identified during the course of the BIST test sequence, the faulty address FAi, F $\overline{\text{Ai}}$ is loaded into the redundant address registers 143–145 and the registers are enabled by the BIST controller 23. Based on an address match between say the test address location $A_0$ input into EOR gates 145, and the 'low' $\overline{\text{Q}}$ output from the register 143 based on the faulty address $FA_0$ location, a 'high' will be output from the exclusive-OR gate 145. Since the $\overline{\text{PRE}}$ signal is 'high' in the active mode, the 'high' from the exclusive-OR gate 145 will produce a 'low' on the input of the redundancy programming device 130 for example, thus allowing the output 146 to remain latched 'high'. This logic comparison is repeated for all the complementary bits. The output 146 will be used to decode a particular redundant memory location in order to replace the faulty normal location (not shown) and it may also be used to indicate to the BIST controller 23 that that particular redundancy programming circuit has been utilized.

Once the redundant cell has replaced the faulty normal cell, the VCP bump test is re-run on the redundant cell. The redundancy replacement process can be continued as the test sequence continues until all the redundancy programming circuits have been used up at which time, any additional attempts to implement redundancy will result in a 'failed device' result.

While the invention has been described in connection with the specific embodiment thereof, and in a specific use, various modifications thereof will occur to those skilled in the art without departing from the spirit of the invention as set forth in the appended claims.

The terms and expressions which have been employed in this specification are used as terms of description and not of limitations, there is no intention in the use of such terms and expressions to exclude any equivalence of the features shown and described or portions thereof, but it is recognized that various modifications are possible within the scope of the claims to the invention.

The embodiments of the invention in which an exclusive property or privilege is claimed are defined as follows:

1. A semiconductor device having a self test circuit comprising:

a) an embedded dynamic random access memory array for storing data;

b) a self test controller for internally generating test data patterns and expected resulting data and for comparing said expected resulting data with actual resulting data;

c) test interface circuitry for loading said test data patterns into said memory and reading back said actual resulting data from said memory during a test sequence; and d) a voltage generator responsive to a control signal for selectively applying one of a plurality of voltages to a selected cell plate of the memory during said test sequence.

2. A semiconductor device as defined in claim 1, including a circuit for storing an address of a defective memory cell.

3. A semiconductor device as defined in claim 2, including a circuit for repairing a defective memory cell in response to a signal received from said self test controller.

4. A method for testing a semiconductor device having an embedded dynamic random access memory array for storing data therein, said method comprising the steps of:

(a) generating test data patterns and expected resulting data in a self test controller;

(b) loading said test data patterns into said memory in a test sequence;

(c) applying a bump test to said memory array cells in accordance with said test data patterns during said test sequence;

(d) reading back said actual resulting data from said memory; and (e) comparing said expected resulting data with said actual resulting data.

5. A method as defined in claim 4, including initiating said test sequence in response to a control signal external to said device.

6. A method as defined in claim 4, including storing each memory address location in a temporary storage within said controller.

7. A method as defined in claim 4, said step of applying a bump test including:

(a) applying a first voltage to a selected memory cell;

(b) writing a test bit to said cell; and (c) subsequently applying a second voltage to said memory cell.

8. A method as defined in claim 7, said first voltage being higher than said second voltage if said test bit is a one.

9. A method as defined in claim 7, said first voltage being lower than said second voltage if said test bit is a zero.

* * * * *